United States Patent [19]

Kawai

[11] 4,424,581
[45] Jan. 3, 1984

[54] LOGIC CIRCUIT WITH A TEST CAPABILITY

[75] Inventor: Masato Kawai, Tokyo, Japan

[73] Assignee: Nippon Electric Co., Ltd., Tokyo, Japan

[21] Appl. No.: 324,707

[22] Filed: Nov. 24, 1981

[30] Foreign Application Priority Data

Nov. 25, 1980 [JP] Japan .................. 55/166074

[51] Int. Cl.³ ........................... G11C 13/00
[52] U.S. Cl. ..................... 365/154; 365/189
[58] Field of Search ................. 365/154, 189

[56] References Cited

U.S. PATENT DOCUMENTS 4,373,195 2/1983 Toyoda et al. .................. 365/154

*Primary Examiner*—Terrell W. Fears
*Attorney, Agent, or Firm*—Sughrue, Mion, Zinn, Macpeak & Seas

[57] ABSTRACT

A flip-flop circuit receives a portion of a multiple bit output from a combinational logic circuit to be tested, and feeds back a plurality of bits to comprise a portion of the multiple bit input to the combinational logic circuit. The flip-flop circuit includes a plurality of master and slave flip-flops with the master flip-flops being operable in parallel to receive the output from the combinational logic circuit or in series as a shift register, and the slave flip-flops being operable either in parallel to receive outputs from the master flip-flops or in series as a shift register. The occurrence of a fault in a combinational logic circuit can be determined by examining the contents of either the master or slave flip-flops at a particular clock cycle.

10 Claims, 19 Drawing Figures

FIG. 5

| CLOCK CYCLE | $Q_5$ | $Q_6$ | $Q_7$ | $Q_8$ |
|---|---|---|---|---|
| 0 | 1 | 0 | 0 | 0 |
| 1 | 1 | 1 | 0 | 0 |
| 2 | 1 | 1 | 1 | 0 |
| 3 | 1 | 1 | 1 | 1 |
| 4 | 0 | 1 | 1 | 1 |
| 5 | 1 | 0 | 1 | 1 |
| 6 | 0 | 1 | 0 | 1 |
| 7 | 1 | 0 | 1 | 0 |
| 8 | 1 | 1 | 0 | 1 |
| 9 | 0 | 1 | 1 | 0 |
| 10 | 0 | 0 | 1 | 1 |
| 11 | 1 | 0 | 0 | 1 |
| 12 | 0 | 1 | 0 | 0 |
| 13 | 0 | 0 | 1 | 0 |
| 14 | 0 | 0 | 0 | 1 |
| ⋮ | ⋮ | ⋮ | ⋮ | ⋮ |

FIG. 7

| CLOCK CYCLE | 130-1 | 130-2 | 130-3 | 130-4 | $Q_1$ | $Q_2$ | $Q_3$ | $Q_4$ |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 1 | 0 | 1 | 0 |
| 3 | 0 | 0 | 1 | 1 | 1 | 1 | 1 | 0 |
| 4 | 0 | 1 | 0 | 0 | 1 | 0 | 1 | 1 |
| 5 | 0 | 1 | 0 | 1 | 0 | 0 | 0 | 0 |
| 6 | 0 | 1 | 1 | 0 | 0 | 1 | 1 | 0 |
| 7 | 0 | 1 | 1 | 1 | 0 | 1 | 0 | 1 |
| 8 | 1 | 0 | 0 | 0 | 1 | 0 | 1 | 0 |
| 9 | 1 | 0 | 0 | 1 | 0 | 1 | 0 | 0 |
| 10 | 1 | 0 | 1 | 0 | 1 | 0 | 0 | 0 |
| 11 | 1 | 0 | 1 | 1 | 0 | 1 | 1 | 1 |
| 12 | 1 | 1 | 0 | 0 | 0 | 1 | 1 | 1 |
| 13 | 1 | 1 | 0 | 1 | 0 | 1 | 1 | 0 |
| 14 | 1 | 1 | 1 | 0 | 1 | 1 | 0 | 1 |
| 15 | 1 | 1 | 1 | 1 | 1 | 0 | 0 | 1 |
| ⋮ | ⋮ | ⋮ | ⋮ | ⋮ | ⋮ | ⋮ | ⋮ | ⋮ |

FIG. 8

| CLOCK CYCLE | 130-1 | 130-2 | 130-3 | 130-4 | $Q_1$ | $Q_2$ | $Q_3$ | $Q_4$ |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 1 | 0 | 1 | 0 |
| 3 | 0 | 0 | 1 | 1 | 1 | 1 | 1 | 0 |
| 4 | 0 | 1 | 0 | 0 | 1 | 0 | 1 | 1 |
| 5 | 0 | 1 | 0 | 1 | 0 | 0 | 0 | 0 |
| 6 | 0 | 1 | 1 | 0 | 0 | 1 | 1 | 0 |
| 7 | 0 | 1 | 1 | 1 | 0 | 1 | 0 | 0 |
| 8 | 1 | 0 | 0 | 0 | 1 | 0 | 1 | 0 |
| 9 | 1 | 0 | (1) | 1 | 0 | 1 | (1) | 0 |
| 10 | 1 | 0 | 1 | 0 | 1 | 0 | 0 | (1) |
| 11 | 1 | 0 | 1 | 1 | (1) | 1 | 1 | 1 |
| 12 | 1 | 1 | 0 | 0 | (1) | (0) | 1 | 1 |
| 13 | 1 | 1 | 0 | 1 | (1) | (0) | (0) | (0) |
| 14 | 1 | 1 | 1 | 0 | (0) | (0) | (1) | (0) |
| 15 | 1 | 1 | 1 | 1 | 1 | (1) | (1) | (0) |

FIG. 13

| CLOCK CYCLE | 130-1 | 130-2 | 130-3 | 130-4 | $Q_1$ | $Q_2$ | $Q_3$ | $Q_4$ |
|---|---|---|---|---|---|---|---|---|
| 0 | 0 | 0 | 0 | 0 | 0 | 0 | 0 | 0 |
| 1 | 0 | (1) | 0 | 1 | 0 | 0 | 0 | 0 |
| 2 | 0 | 0 | 1 | 0 | 0 | (1) | 0 | 1 |
| 3 | 0 | 0 | 1 | 1 | 0 | 0 | (0) | 0 |
| 4 | 0 | 1 | 0 | 0 | (0) | 0 | 1 | (1) |
| 5 | 0 | 1 | 0 | 1 | (1) | (1) | 0 | 1 |
| 6 | 0 | 1 | 1 | 0 | (1) | (0) | (1) | 1 |
| 7 | 0 | 1 | 1 | 1 | 0 | (0) | (1) | (1) |
| 8 | 1 | 0 | 0 | 0 | (1) | 1 | (1) | (0) |

FIG. 14

| CLOCK CYCLE | $Q_5$ | $Q_6$ | $Q_7$ | $Q_8$ |
|---|---|---|---|---|
| 0 | 1 | 0 | 0 | 0 |
| 1 | 0 | 1 | 0 | 0 |
| 2 | 1 | 0 | 1 | 0 |
| 3 | 0 | 1 | 0 | 1 |
| 4 | 0 | 0 | 1 | 0 |
| 5 | 0 | 0 | 0 | 1 |

FIG. 11

| CLOCK CYCLE | Q5 | Q6 | Q7 | Q8 |
|---|---|---|---|---|
| 0 | 1 | 0 | 1 | 0 |
| 1 | 0 | 1 | 0 | 1 |
| 2 | 0 | 0 | 1 | 0 |
| 3 | 1 | 0 | 0 | 1 |
| 4 | 1 | 1 | 0 | 0 |
| 5 | 1 | 1 | 1 | 0 |
| 6 | 0 | 1 | 1 | 1 |
| 7 | 0 | 0 | 1 | 1 |
| 8 | 0 | 1 | 0 | 1 |

FIG. 12

| CLOCK CYCLE | 130-1 | 130-2 | 130-3 | 130-4 | Q1 | Q2 | Q3 | Q4 |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 0 |
| 2 | 0 | 0 | 1 | 0 | 0 | 0 | 0 | 1 |
| 3 | 0 | 0 | 1 | 1 | 0 | 0 | 1 | 0 |
| 4 | 0 | 1 | 0 | 0 | 1 | 0 | 1 | 0 |
| 5 | 0 | 1 | 0 | 1 | 0 | 0 | 0 | 1 |
| 6 | 0 | 1 | 1 | 0 | 0 | 1 | 0 | 1 |
| 7 | 0 | 1 | 1 | 1 | 0 | 1 | 0 | 0 |
| 8 | 1 | 0 | 0 | 0 | 0 | 1 | 0 | 1 |

FIG. 15

| CLOCK CYCLE | 130-1 | 130-2 | 130-3 | 130-4 | Q1 | Q2 | Q3 | Q4 |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 0 |
| 2 | 0 | 0 | 1 | 0 | 0 | 0 | 0 | 1 |
| 3 | 0 | 0 | 1 | 1 | 1 | 0 | 1 | 0 |
| 4 | 0 | 1 | 0 | 0 | 0 | 1 | 1 | 0 |
| 5 | 0 | 1 | 0 | 1 | 1 | 1 | 1 | 1 |

FIG. 16

| CLOCK CYCLE | 130-1 | 130-2 | 130-3 | 130-4 | Q1 | Q2 | Q3 | Q4 |
|---|---|---|---|---|---|---|---|---|
| 0 | 0 | 0 | 0 | 0 | 0 | 0 | 0 | 0 |
| 1 | 0 | (1) | 0 | 1 | 0 | 0 | 0 | 0 |
| 2 | 0 | 0 | 1 | 0 | 0 | (1) | 0 | 1 |
| 3 | 0 | 0 | 1 | 1 | (0) | 0 | (0) | 0 |
| 4 | 0 | 1 | 0 | 1 | 0 | (0) | 1 | (1) |
| 5 | 0 | 1 | 0 | 0 | 1 | 1 | (0) | 1 |

LOGIC CIRCUIT WITH A TEST CAPABILITY

BACKGROUND OF THE INVENTION

The present invention relates to a logic circuit for use in an arithmetic/logic unit in a computer and, more particularly, to a logic circuit capable of performing the test operation.

Out of various testing systems proposed hitherto, a testing system using a scan path is well known. This system is designed to use, as such a scan path, a shift register made of cascade-connected F/Fs usually serving as a logic circuit. More clearly, in the test operation, a test pattern is scanned into the register and the response of the pattern is scanned out from the register. For details of such scan path technique, reference is made to a paper entitled "Test Generation Systems in Japan" by Funatsu et al in "12th Design Automation Conference", pp. 114–122, published in 1975 by IEEE. This still involves a problem that such a scan-in and scan-out operation needs a comparatively long time.

Another testing system proposed as an improved version of the scan path system comprises a plurality of shift registers connected serially, each register being made up of cascade-connected F/Fs with plural feedback loops. This improved testing system functions to generate pseudorandom test patterns. Another function of the same system is to minimize the total bit amount required to output test results by the following data compression technique. More clearly, to so function, the system sequentially supplies the shift registers with each of given test patterns, performs a single predetermined arithmetic operation not for each response but rather for the collective responses of the patterns, and then generates the calculation result (each response is unreproducible from the calculation result). For details of this system, reference is made to a paper entitled "Built-in Logic Block Observation Techniques" by Bernd Könemann et al in "1979 IEEE Test Conference" pp. 37–41, published in 1979 by IEEE. This system greatly reduces the testing time by automatic generation of the test patterns as well as by data compression for the reduction in the total amount of the output data from the logic unit. However, since a circuit to be tested cannot be divided into a plurality of blocks to be subjected to block-by-block testing with this system, a prohibitive amount of test data and a long testing time are needed to test the entire circuit.

SUMMARY OF THE INVENTION

An object of the present invention is therefore to provide a logic circuit with a test capability which is free from the above-mentioned disadvantages inherent in the prior art testing systems.

A logic circuit embodying the present invention comprises a combinational network for receiving in parallel a bit pattern which consists of a plurality of signals and for producing a bit pattern in parallel; a group of master F/Fs for sequentially receiving a part of the output bit pattern of said combinational network; a group of slave F/Fs corresponding to said individual F/Fs in the master group, said slave F/F group sequentially receiving the output bit pattern of the master F/F group and feeding it back to said combinational network; means for cascade-connecting the F/Fs in the master group to constitute a shift register with a feedback loop; and means for cascade-connecting the F/Fs in the slave group to constitute a shift register with a feedback loop.

BRIEF DESCRIPTION OF THE DRAWINGS

The present invention will be described in greater detail with reference to the accompanying drawings wherein:

FIGS. 4 to 8 show timing charts for describing the operation of the embodiment;

FIGS. 11 to 13 show tables for demonstrating the operation of the flip-flop network shown in FIG. 9; and FIGS. 14 to 16 show tables for describing the operation of the flip-flop network shown in FIG. 10.

In the drawings, the same reference numerals denote the same structural elements, and each circle shown with a gate represents an inversion of a given input or output.

DETAILED DESCRIPTION OF THE INVENTION

Figure 1:
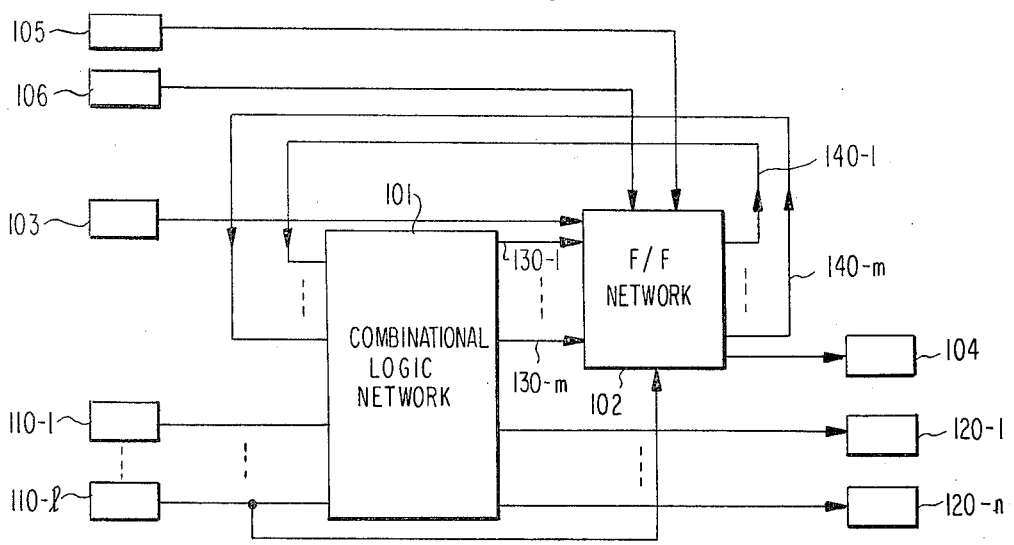
FIG. 1 shows an embodiment of the present invention.

Referring to FIG. 1, the logic circuit of the present invention comprises a combinational network 101 and a master/slave F/F network 102 which receives a part of the output of the network 101 through lines 130-1 to 130-m and in turn supplies the network 101 with a part of its output through lines 140-1 to 140-m. The logic circuit also comprises a terminal 103 for scanning test patterns into the network 102, a terminal 104 for scanning out a part of the output of the network 102, control signal terminals 105 and 106 for controlling the operation of the network 102, input terminals 110-1 to 110-l to the network 101, and output terminal 120-1 to 120-n from the network 101.

The network 101 has the same structure as the combinational network 40, 41, or 42 shown in FIG. 5 of the U.S. Pat. No. 3,761,695.

In the normal mode of operation, the illustrated logic circuit uses the network 102 as a typical master/slave F/F network and causes a circuit to be tested, which brings the entire circuit shown in FIG. 1 into operation as a synchronous sequential circuit. In a specific test mode, control signals are given from the terminals 105 and 106 to the network 102 to cause it to form shift registers. Then, an initial bit pattern for testing is serially supplied from the terminal 103 to the network 102 so that the combinational network 101 can be supplied with a desired test pattern. The test pattern loaded into the network 102 can be observed serially through the terminal 104. Therefore, the output of the network 101 can be fully observed by combining the output bit produced through the terminal 104 with the output bits generated in parallel through the terminals 120-1 to 120-n so as to form the response of a given test pattern.

Figure 2:
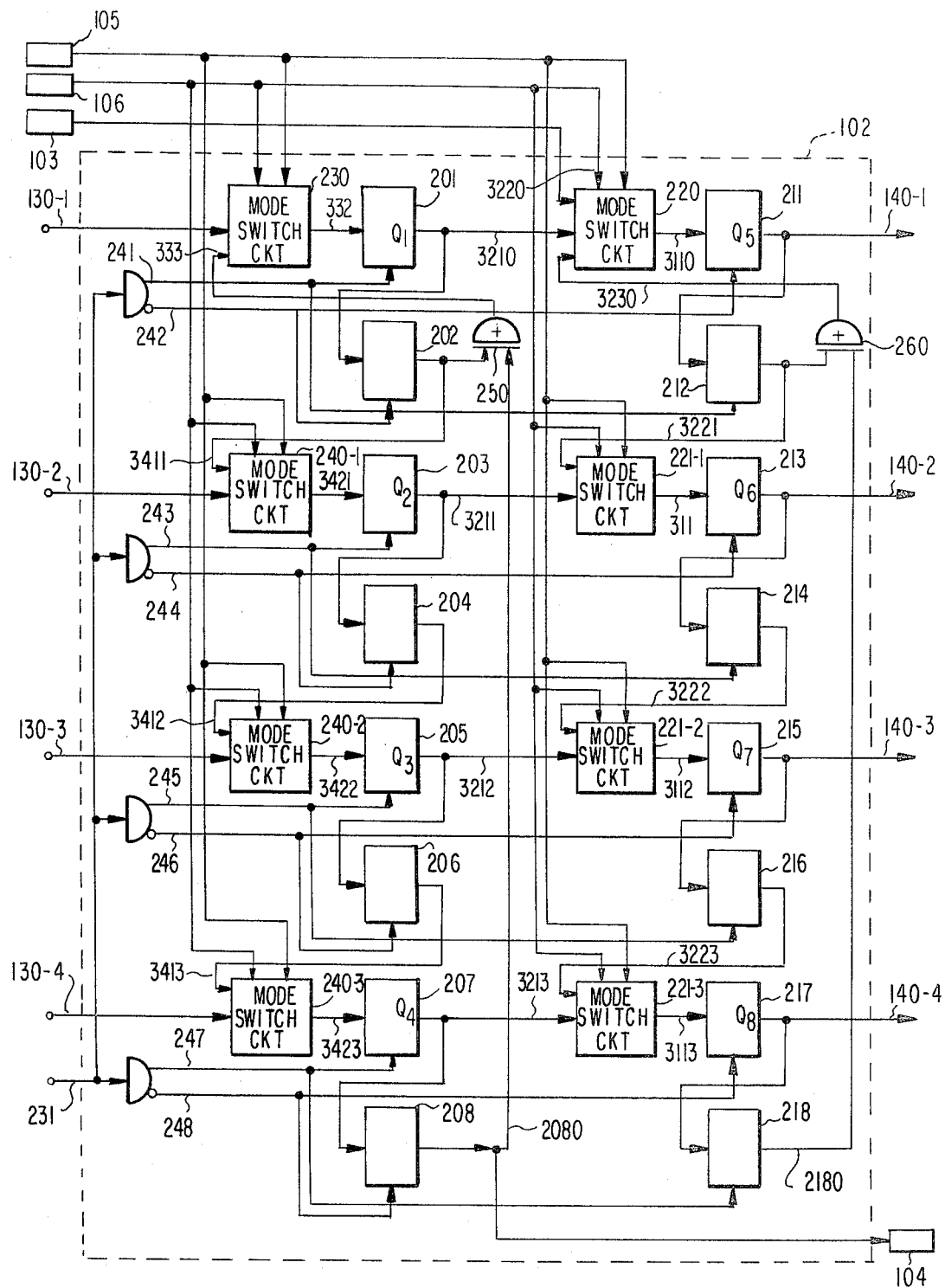
FIG. 2 shows a detailed diagram of an F/F network shown in FIG. 1.

A first example of the network 102 is illustrated in FIG. 2. As shown, the network 102 comprises a group of master F/Fs 201 to 208, a group of slave F/Fs 211 to 218, four-mode switching circuits 220, 221-1 to 221-3, 230, and 240-1 to 240-3, and Exclusive OR (EOR) gates 250 and 260. During the normal mode of operation, an input bit pattern is given in parallel from the terminals 110-1 to 110-l to the network 101. The output bit pattern of the network 101 is then given in parallel to the F/Fs 201 to 208 of the network 102 through the lines 130-1 to 130-m (FIG. 1). The contents stored in the F/Fs 201 to 208 are then supplied in parallel to the F/Fs 211 to 218 in synchronism with a clock pulse given from the terminal 110-1 through a line 231. In the test mode, an initial bit pattern for testing is sequentially loaded from the scan-in terminal 103 into the slave F/Fs 211 to 218 which will be cascade-connected to form a shift register. The bit pattern stored in the F/Fs 201 to 208 is sequentially outputted to the terminal 104 through the shift register (i.e. F/Fs 201 to 208) for observation.

Figure 3A:
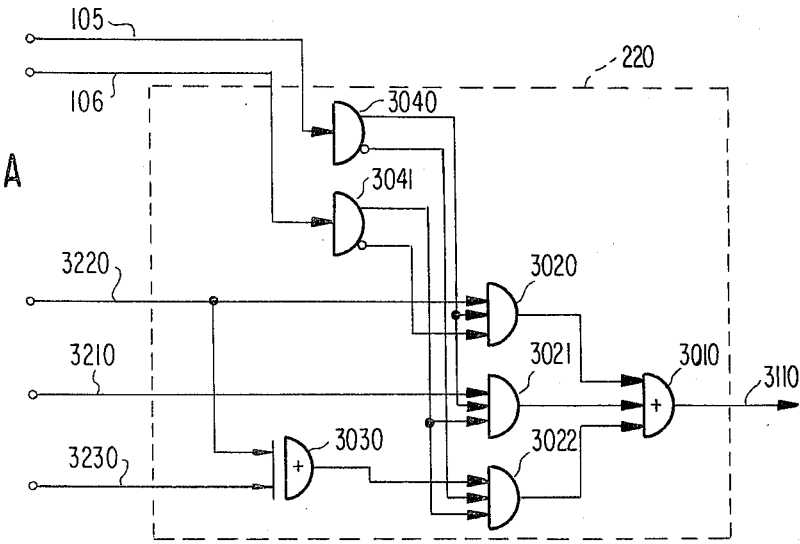
FIGS. 3A to 3D show details of four different mode switching circuits shown in FIG. 2, respectively.

Referring to FIG. 3A, the mode switch circuit 220 comprises an OR gate 3010, AND gates 3020, 3021, and 3022, an EOR gate 3030, and gates 3040 and 3041. The circuit 220 selects one of three bit patterns by a combination of the "1" or "0" appearing at each of the terminals 105 and 106 (FIG. 2). One of the three bit patterns to be chosen is sequentially given from the master F/F 201 to the gate 3021 of the circuit 220 via a line 3210 shown in FIG. 3A. Another bit pattern is serially given from the scan-in terminal 103 to the gate 3020 through a line 3220. The remaining bit pattern is given in serial form from the gate 3030 to the gate 3022. The gate 3030 generates an EOR signal of the output of the F/F 212 and that of the feedback loop 2180 given from the gate 260 through a line 3230. Details of the operation of this circuit are defined in Table 1 shown below.

TABLE 1

| Mode | 105 | 106 | Operation |
| --- | --- | --- | --- |
| RESET MODE | 0 | 0 | The F/Fs 211 and 212 are set to "0" in synchronism with clock pulses. |
| NORMAL MODE | 1 | 1 | The F/Fs 211 and 212 sequentially store the output of the master F/F 201 in synchronism with clock pulses. |
| SHIFT MODE | 1 | 0 | The F/Fs 211 and 212 sequentially store the bit pattern given from the terminal 103 in synchronism with clock pulses. |
| FEEDBACK MODE | 0 | 1 | The F/Fs 211 and 212 sequentially store the EOR result of the bit pattern from the terminal 103 and the bit pattern from the EOR gate 260 via the line 3230 in synchronism with clock pulses. |

Figure 3B:
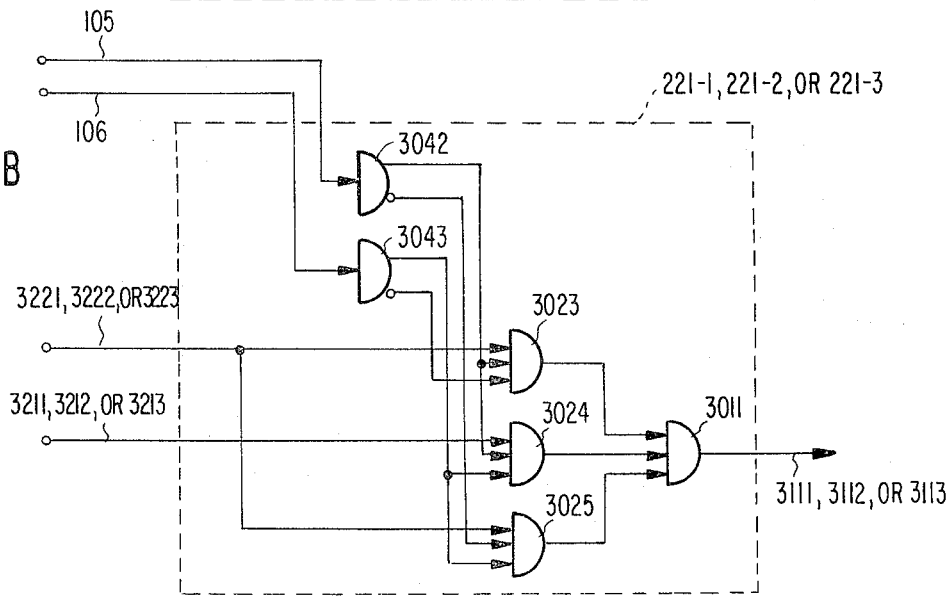

Referring to FIG. 3B, the mode switching circuit 221-1 comprises an OR gate 3011, AND gates 3023, 3024 and 3025, and gates 3042 and 3043. Each of the circuits 221-2 and 221-3 has the same structure as that of the circuit 221-1. In response to combinations of the "1" or "0" appearing at each of the terminals 105 and 106, the circuit 221-1 selects one of two bit patterns. One of the two bit patterns is serially given from the master F/F 203 to the gate 3024 of the circuit 221-1 via a line 3211 shown in FIG. 3B. The other of the bit patterns is given in serial form from the F/F 212 to the gates 3023 and 3025 through a line 3221. Each of the circuits 221-2 and 221-3 performs the same operation as that of the circuit 221-1. Details of the operation of this circuit are indicated in Table 2.

TABLE 2

| Mode | 105 | 106 | Operation |
| --- | --- | --- | --- |
| RESET MODE | 0 | 0 | The F/Fs 213 to 218 are set to "0" in synchronism with clock pulses. |
| NORMAL MODE | 1 | 1 | The F/Fs 213 to 218 sequentially store the outputs of the corresponding master F/Fs 203, 205, and 207 in synchronism with clock pulses. |
| SHIFT MODE | 1 | 0 | The F/Fs 213 to 218 sequentially store the outputs |
|  | 0 | 1 | of the corresponding F/Fs 212 to 217 in synchronism with clock pulses. |

Figure 3C:
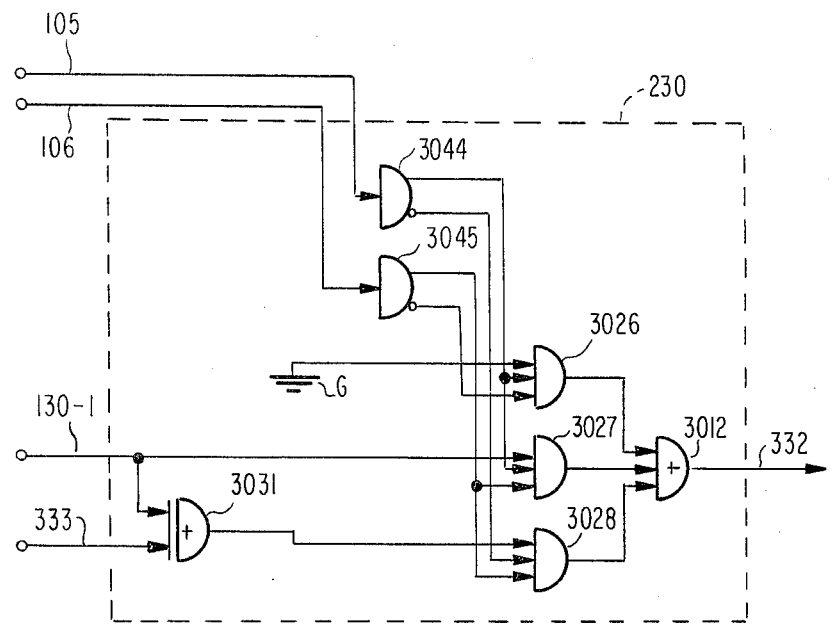

Referring to FIG. 3C, the mode switch 230 comprises an OR gate 3012, AND gates 3026, 3027, and 3028, and EOR gate 3031, and gates 3044 and 3045. In response to combinations of the "1" or "0" present at each of the terminals 105 and 106, this circuit 230 selects one of three bit patterns. One of the three bit patterns is serially given from the network 101 (FIG. 1) to the gate 3027 of the circuit 230 via the line 130-1 shown in FIG. 3C. Another bit pattern is sequentially given from the gate 3031 to the gate 3028. The gate 3031 generates an EOR signal of the output of the network 101 and that of the feedback loop given from the gate 250 through a line 333. The remaining bit pattern is serially given from a ground source G to the gate 3026. Details of the operation of this circuit 230 are shown in Table 3.

TABLE 3

| Mode | 105 | 106 | Operation |
| --- | --- | --- | --- |
| RESET MODE | 0 | 0 | The F/Fs 201 and 202 are set |
|  | 1 | 0 | to "0" in synchronism with clock pulses. |
| NORMAL MODE | 1 | 1 | The F/Fs 201 and 202 sequentially store the output of the network 101 in synchronism with clock pulses. |
| FEEDBACK MODE | 0 | 1 | The F/Fs 201 and 202 sequentially store the EOR result of the output of the network 101 and the bit pattern from the EOR gate 250 via the line 333 in synchronism with clock pulses. |

Figure 3D:
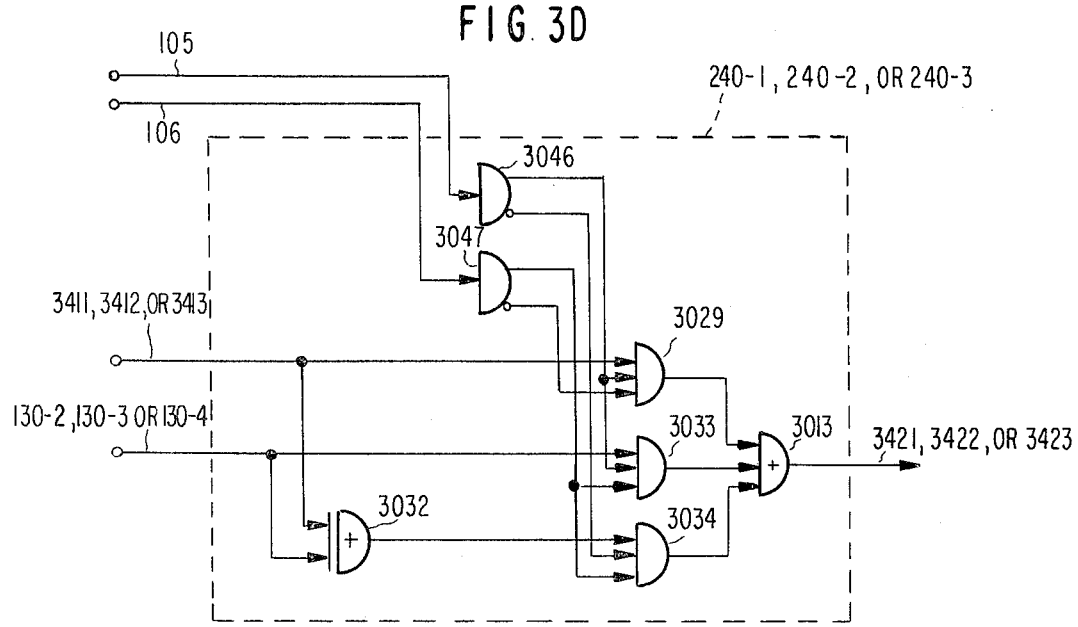

Referring to FIG. 3D, the mode switching circuit 240-1 is composed of an OR gate 3013, AND gates 3029, 3033 and 3034, an EOR gate 3032, and gates 3046 and 3047. Each of the circuits 240-2 and 240-3 has the same structure as that of the circuit 240-1. In response to combinations of the "1" or "0" present at each of the terminals 105 and 106, the circuit 240-1 selects one of three bit patterns. One of the three bit patterns is serially supplied from the F/F 202 to the gate 3029 of the circuit 240-1 via a line 3411 shown in FIG. 3D. Another bit pattern is sequentially given from the network 101 to (FIG. 1) to the gate 3033 through a line 130-2. The remaining bit pattern is serially given from the gate 3032 to the gate 3034. The gate 3032 generates an EOR signal of the output of the F/F 202 and that of the network 101. Each of the circuits 240-2 and 240-3 performs the same operation as that of the circuit 240-1. Details of the operation of this circuit 240 are shown in Table 4.

TABLE 4

| Mode | 105 | 106 | Operation |
| --- | --- | --- | --- |
| RESET MODE | 0 | 0 | The F/Fs 203 to 208 are set to "0" in synchronism with |

TABLE 4-continued

| Mode | 105 | 106 | Operation |
|---|---|---|---|
| | | | clock pulses. |
| NORMAL MODE | 1 | 1 | The F/Fs 203 to 208 sequentially store the output of the network 101 in synchronism with clock pulses. |
| SHIFT MODE | 1 | 0 | The F/Fs 203 to 208 sequentially store the bit pattern from the corresponding F/Fs 202, 204, and 206 in synchronism with clock pulses. |
| FEEDBACK MODE | 0 | 1 | The F/Fs 203 to 208 sequentially store the EOR result of the output of the network 101 and that from the corresponding F/Fs 202, 204, and 206 in synchronism with clock pulses. |

The operation of the above-mentioned embodiment will now be described in detail with reference to FIGS. 1 to 8 and Tables 1 to 4.

The logic circuit performs the normal operation and the specific testing operation. The testing operation consists of sequential steps of initialization, test, and observation of the response of a given test pattern.

Normal Operation

The combinational network 101 generates a bit pattern in parallel through the lines 130-1 to 130-n. In response to "1 and 1" appearing at the terminals 105 and 106 shown in FIG. 1, said bit pattern is fed back in parallel to the network 101 by way of the mode switching circuits 230 and 240, the master F/Fs 201, 203, 205, and 207, the mode switching circuits 220 and 221, the slave F/Fs 211, 213, 215 and 217 (FIG. 2), and the lines 140-1, 140-2, 140-3, and 140-4. During this operation, the circuits 220, 221, 230, and 240 operate in their normal modes indicated in Tables 1 to 4, respectively.

Testing Operation (1) Initialization

For this purpose, the logic circuit is operated in the reset mode and then in the shift mode. In the reset mode, all the F/Fs 201 to 208 and 211 to 218 shown in FIG. 2 are set in "0". The circuits 220, 221, 230, and 240 commonly operate in the normal modes indicated in Tables 1 to 4. In the subsequent shift mode, the master F/Fs 201 to 208 operate as a shift register in response to clock pulses given from the terminal 110-1 via the line 231. The input bit pattern to this shift register is determined by the output bit pattern of the switching circuit 230. Since the control signals supplied from the terminals 105 and 106 are "1 and 0", the switching circuit 230 operates in the reset mode indicated in Table 3. Therefore, the output bit of the circuit 230 is "0". The switching circuit 240 is operated in the shift mode indicated in Table 4, whereby the master F/Fs 201 to 208 are controlled to function as a shift register and thus their output bits become all "0". Likewise, the other switching circuits 220 and 221 operate in their shift modes allowing the slave F/Fs 211 to 218 to function as a shift register. As soon as an input bit pattern "0, 0, 0, and 1" is sequentially set at the scan-in terminal 103, the slave F/Fs 211 to 218 are serially loaded with a bit pattern "1, 1, 0, 0, 0, 0". This is the initial value to be loaded in the network 101 as a test pattern.

(2) Test

Figure 4:
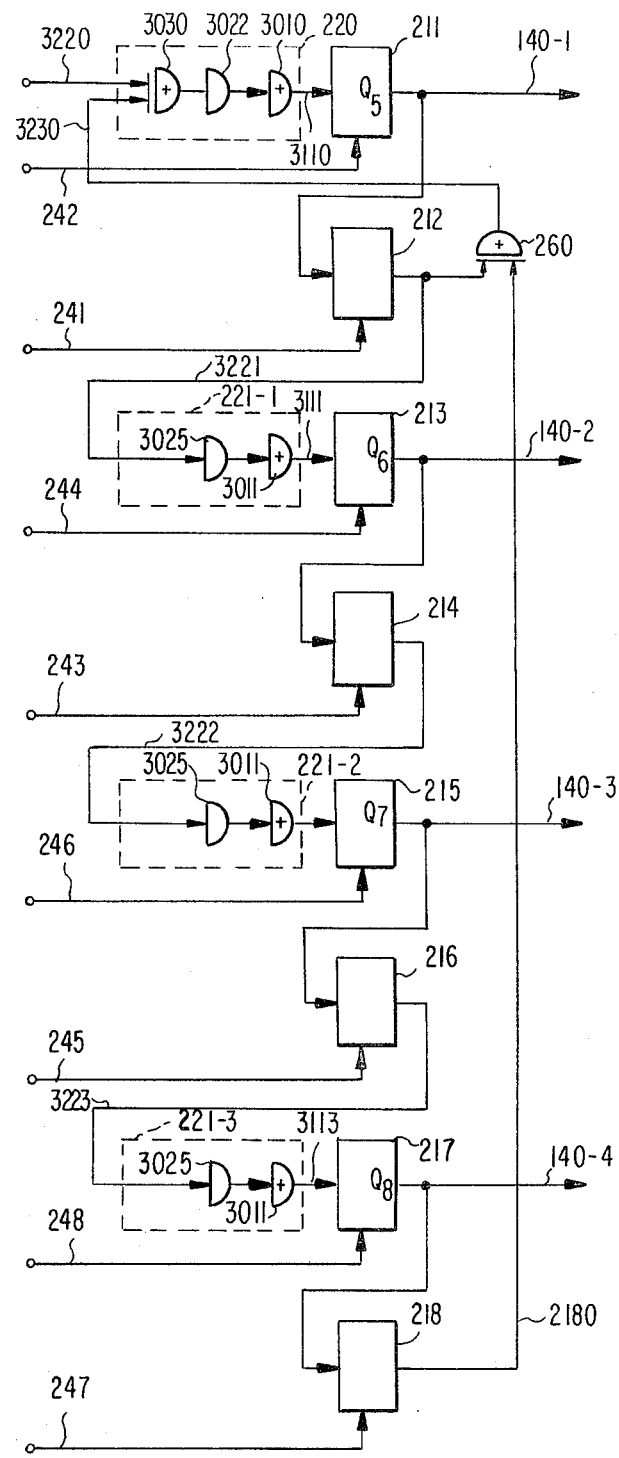
Figure 6:
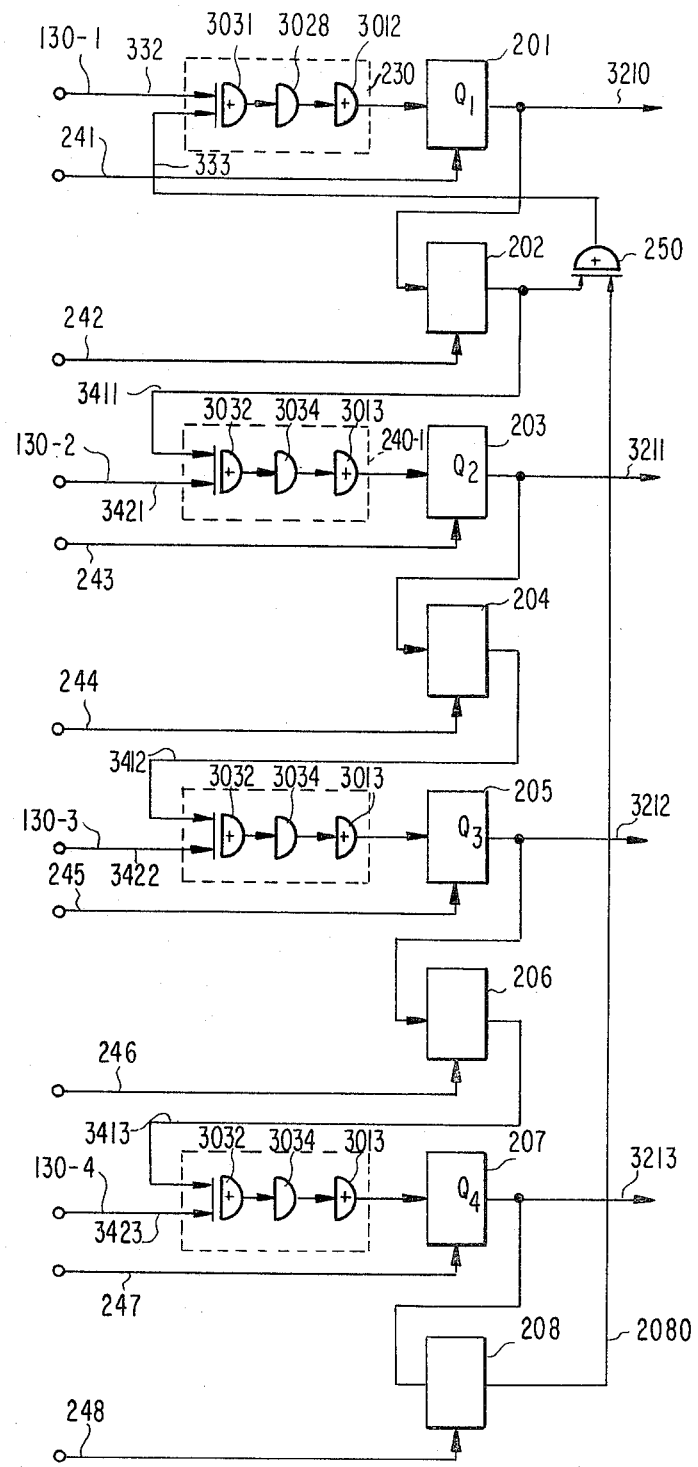

A test is practiced in the feedback mode. In response to "0 and 1" present at the terminals 105 and 106, the switching circuits 220, 230, and 240 operate in the feedback modes indicated in Tables 1, 3, and 4, respectively. The switching circuit 221, on the other hand, is operated in the shift mode shown in Table 2 in response to the same control signals. As a result, the entire circuit of FIG. 2 becomes equivalent to the circuits of FIGS. 4 and 6 taken in combination. FIG. 4 represents the slave F/Fs 211 to 218 and their associated structural elements. FIG. 6 represents the master F/Fs 201 to 208 and their associated structural elements.

Referring to FIG. 4, in response to clock pulses given to the individual slave F/Fs 211 to 218, the output bit pattern of the F/Fs 211, 213, 215, and 217 is sequentially changed as indicated by ($Q_5$, $Q_6$, $Q_7$ and $Q_8$) in FIG. 5.

Referring to FIG. 5, the output bit pattern ($Q_5$, $Q_6$, $Q_7$, and $Q_8$) is set in "1, 0, 0, 0" at clock cycle 0. Thereafter, mutually different bit patterns are sequentially generated at clock cycles 1 to 14. Similar bit patterns will serially be generated by the F/Fs 211, 213, 215, and 217 in the subsequent successive clock cycles 15 to 29, though not shown in FIG. 5. These bit patterns are determined by the combination of contents of the bits $Q_5$ to $Q_8$ and, thus, usable as random patterns. Stated another way, the structure shown in FIG. 4 serves the function of a random pattern generator consisting of a linear feedback register.

Referring to FIG. 6 the output bit pattern $Q_1$ to $Q_4$ of the F/Fs 201, 203, 205, and 207 is successively varied in response to clock pulses supplied to the individual master F/Fs 201 to 208. This sequential variation is indicated in FIG. 7.

Referring to FIG. 7, the output bit pattern ($Q_1$, $Q_2$, $Q_3$, and $Q_4$) of the F/Fs 201, 203, 205, and 207 is "0, 0, 0, 0" at clock cycle 0. At the next clock cycle 1, the output bit pattern ($Q_1$, $Q_2$, $Q_3$ and $Q_4$) of the F/Fs 201, 203, 205, and 207 becomes "0, 0, 0, 1" in response to a bit pattern "0, 0, 0, and 1" supplied through the signal lines 130-1, 130-2, 130-3, and 130-4. Thereafter, when the fifteenth clock pulse is supplied together with the bit pattern shown in FIG. 7, the output bit pattern of the F/Fs 201, 203, 205, and 207 becomes "1, 0, 0, 1".

(3) Observation of the response of a given test pattern

Referring to FIG. 8, a fault in the combinational network 101 is detected in the following manner. When any fault occurs in the network 101, a test pattern is given in parallel from the network 101 to the network 102 through the lines 130-1, 130-2, 130-3, and 130-4. Assuming that the adverse effect of the fault in the network 101 appears on the line 130-3 at clock cycle 9, this effect is transmitted sequentially to the master F/Fs 201 to 208 so that the output bit pattern of the F/Fs 201, 203, 205, and 207 becomes "1, 1, 1, and 0" at clock cycle 15. This output bit pattern of the F/Fs 201, 203, 205 and 207 is different from the output bit pattern "1, 0, 0, 1", which is to be generated by the same F/Fs under the fault free (normal) state as shown in FIG. 5. Such a difference in bit pattern indicates a fault in the network 101.

As will now be seen, the master F/Fs 201 to 208 function as a compressor for compressing output data of a circuit under test because a fault can be detected merely by observing the output bit pattern $Q_1$ to $Q_4$ of the F/Fs 201, 203, 205, and 207 at a specific observation cycle (clock cycle 15 in the above embodiment), that is, without checking each output bit pattern $Q_1$ to $Q_4$ at all the cycles. If the master F/Fs 201 to 208 (FIG. 2) are arranged as shown in FIG. 5, bit patterns from the network 101 can be tested with efficiency using the master F/Fs 201 to 208 as a data compressor.

Figure 9:
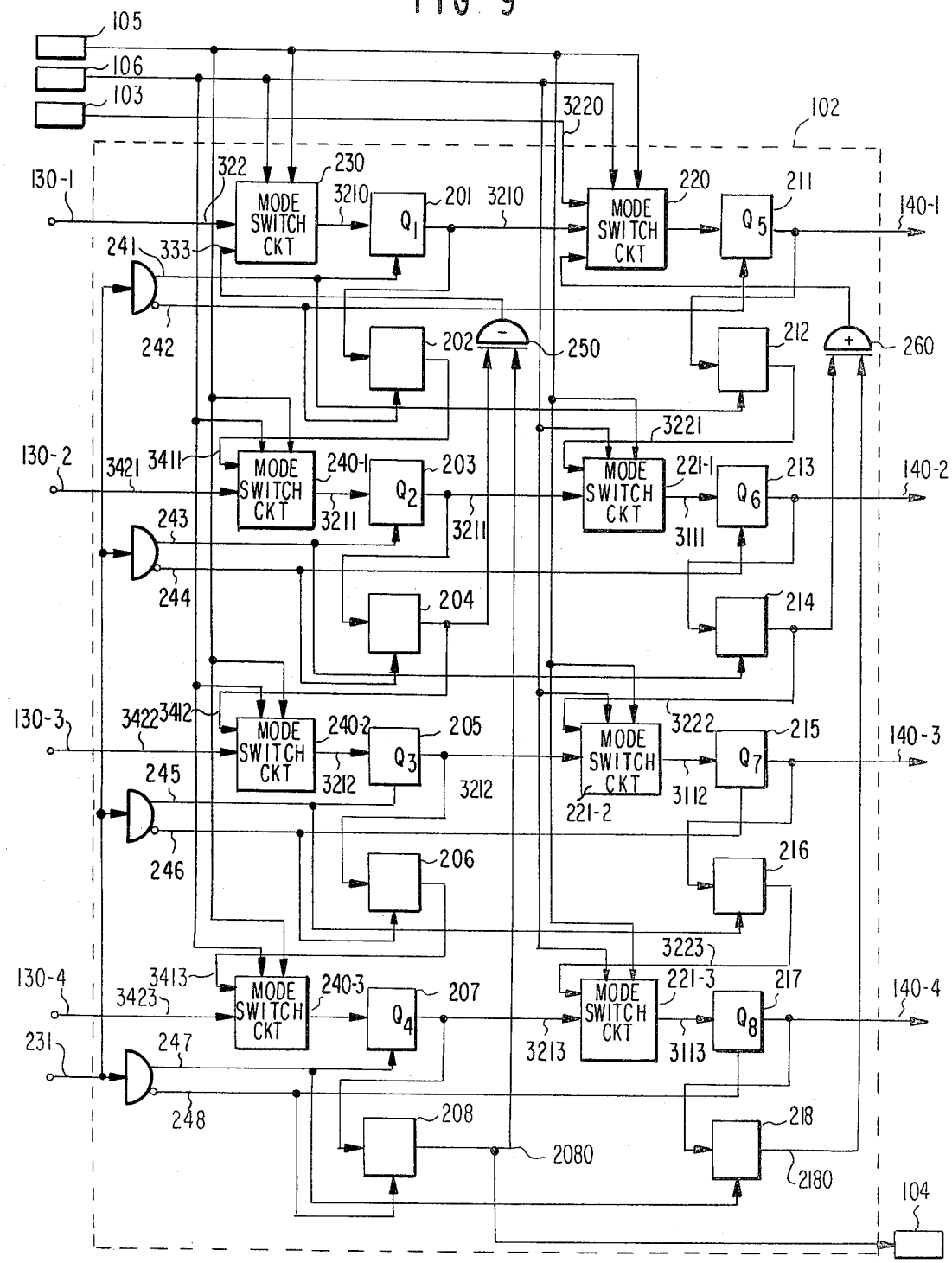
FIGS. 9 and 10 show modifications to the F/F network shown in FIG. 2.

An alternative arrangement of the network 102 is illustrated in FIG. 9. Whereas the network 102 discussed with reference to FIG. 2 has one input terminal of the EOR gate 250 connected with the output terminal of the F/F 202 and one input terminal of the EOR gate 260 with the output terminal of the F/F 212, the network 102 (FIG. 9) has one input terminal of the EOR gates 250 and 260 connected with the output terminals of the F/Fs 204 and 214, respectively.

Figure 10:
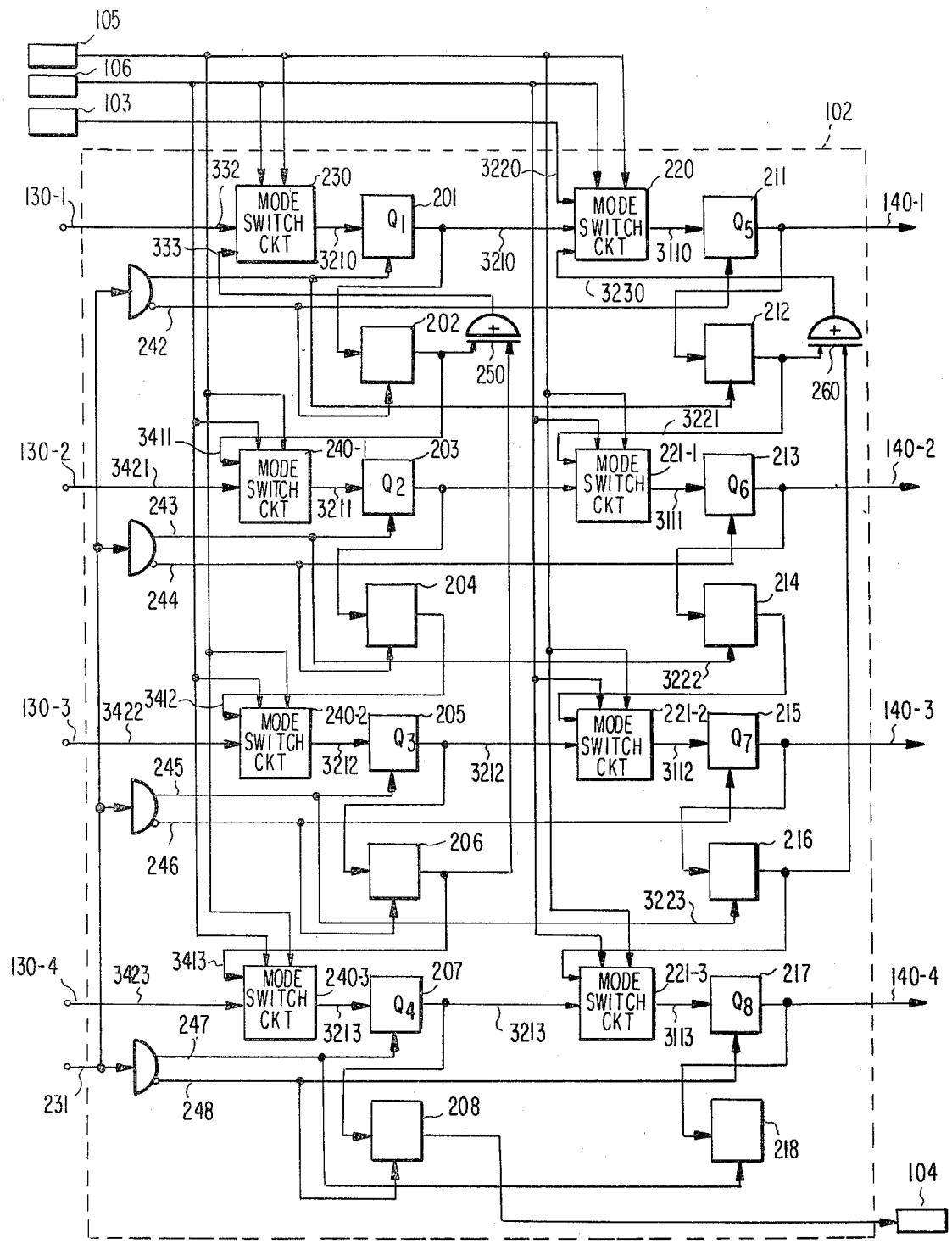

Another alternative arrangement of the network 102 is shown in FIG. 10. The other input terminals of the EOR gates 250 and 260 in FIGS. 2 and 9 are connected with the output terminals of the F/Fs 208 and 218, respectively. In contrast, the other input terminals of the EOR gates 250 and 260 in FIG. 10 are connected with the output terminals of the F/Fs 206 and 216, respectively.

The operation of the network 102 depicted in FIG. 9 will be understood from FIGS. 11 to 13.

Referring to FIGS. 1, 9, and 11 to 13, the operation of a second embodiment will be described. The second embodiment performs the same operations as the first embodiment in its reset operation and in the initialization in the testing operation. It should be noted, however, in the initializing step, that the slave F/Fs 211 to 218 in the second embodiment generate a bit pattern "1, 1, 0, 0, 1, 1, 0, 0" in response to an input bit pattern "0, 1, 0, 1" from the scan-in terminal 103 shown in FIG. 9.

Referring to FIG. 11, at a clock cycle 0, the output bit pattern ($Q_5, Q_6, Q_7$ and $Q_8$) is set to "1, 0, 1, 0". This is followed by sequentially generated bit patterns at clock cycles 1 to 8 which are all different from one another. These bit patterns are dictated by the combination of contents of the bits $Q_5$ to $Q_8$ and, thus, they are usable as random patterns.

Referring to FIG. 12, at clock cycle 0, the output bit pattern ($Q_1, Q_2, Q_3$ and $Q_4$) of the F/Fs 201, 203, 205, and 207 is "0, 0, 0, 0". When a bit pattern "0, 0, 0, 1" is supplied at the next clock cycle 1 via the lines 130-1 to 130-4, the output bit pattern remains "0, 0, 0, 0".

Referring to FIG. 13, a fault in the network 101 will be detected in the following manner. When a certain fault occurs in the network 101, which is transmitted to the network 102 through the lines 130-1 to 130-4, its adverse effect is transmitted sequentially to the master F/F 203 by way of the line 130-2 at clock cycle 1. This is reflected by an output bit pattern "1, 1, 1, 0" of the F/Fs 201, 203, 205, and 207 at clock cycle 8. This output bit pattern is not identical with the bit pattern "0, 1, 0, 1" shown in FIG. 12, which is to be generated by the same F/Fs under the fault free state, indicating that a fault occurred in the network 101.

Again, it will be seen that the master F/Fs 201 to 208 function as a data compressor which permits a fault to be found out merely by observing the output bit pattern $Q_1$ to $Q_4$ of the F/Fs 201, 203, 205, and 207 at the clock cycle 8, that is, without any observation of each bit pattern $Q_1$ to $Q_4$ at all the clock cycles.

FIGS. 14 to 16 demonstrate the operation of the third example of the network 102 illustrated in FIG. 10.

Referring to FIGS. 1, 10, and 14 to 16, the operation of a third embodiment will be discussed. This embodiment performs the same operations as the first embodiment in its normal operation and its initialization in the testing operation.

Referring to FIG. 14, at clock cycle 0, the slave F/Fs 211, 213, 215, and 217 generate an output bit pattern ($Q_5, Q_6, Q_7$, and $Q_8$), which is "1, 0, 0, 0". Subsequently, they sequentially generate other bit patterns which are all different from one another at clock cycles 1 to 5. Again, these bit patterns are dictated by the combination of contents of the bits $Q_5$ to $Q_8$ and thus usable as random patterns.

Referring to FIG. 15, at clock cycle 0, the F/Fs 201, 203, 205, and 207 generate an output bit pattern ($Q_1, Q_2, Q_3$, and $Q_4$), which is "0, 0, 0, and 0" as in the operation of the circiuit of FIG. 12. At the next clock cycle 1, the output bit pattern ($Q_1, Q_2, Q_3, Q_4$) becomes "0, 0, 0, 0".

A fault detection in the combinational circuit 101 will be described with reference to FIG. 16. When a certain fault occurs in the network 101, which is transmitted to the network 102 through the lines 130-1 to 130-4, this adverse effect appears on the line 130-2 at clock cycle 1 and is sequentially transmitted to the master F/Fs 201 to 208. Then, the output bit pattern ($Q_1, Q_2, Q_3, Q_4$) becomes "1, 1, 0, 1" at clock cycle 5. This output bit patter differs from the output bit pattern "1, 1, 1, 1" shown in FIG. 15, which is to be generated under the normal state, representing the occurrence of a fault in the network 101. This embodiment as well as the first and second embodiments use the master F/Fs 201 to 208 as a data compressor which achieves fault detection without any observation of the bit patterns of the F/Fs 201, 203, 205, and 207 at all the clock cycles by merely observing the output bit pattern $Q_1$ to $Q_4$ at the clock cycle 5 only.

In summary, it will be seen that the present invention allows the easy generation of test patterns and a significant reduction in the required observation time due to the high speed application of the patterns by virtue of the shift register arrangements with the feedback loops.

Various modifications will become possible for those skilled in the art within the scope of the present invention defined by the appended claims.

What is claimed is:

1. A logic circuit comprising:
   a combinational network for receiving in parallel a bit pattern which comprises at least first and second groups of input signals and for producing a corresponding parallel bit pattern output comprising at least first and second groups of output signals;
   a group of master flip-flops for receiving said first group of output signals from said combinational network;
   a group of slave flip-flops corresponding to respective ones of said master flip-flops, said slave flip-flops receiving the output bit pattern of said master flip-flops and feeding said master flip-flop output bit pattern back to said combinational network as said first group of input signals;
   first means for cascade-connecting said master flip-flops to form a shift register with a feedback loop; and
   second means for cascade-connecting said slave flip-flops to form a shift register with a feedback loop.

2. A logic circuit as claimed in claim 1, wherein said first means comprises a first plurality of switch circuits each providing an output to a respective one of said master flip-flops, each of said switch circuits receiving as a first input a respective one of said first group of output signals, and receiving a second input, each said switching circuit selectively providing said first input as its output in response to a first control signal and providing as its output a logical combination of said first and second inputs in response to a second control signal, said first means further comprising means for providing said first and second control signals to said switch circuit and feedback means responsive to an output from at least one of said master flip-flops for providing said second input to said first switch circuit.

3. A logic circuit as claimed in claim 1 or 2, wherein said second means comprises a second plurality of switch circuits each providing an output to a respective one of said slave flip-flops, each of said second plurality of switch circuits receiving as a first input an output from a respective one of said master flip-flops, and receiving a second input, each of said second plurality of switch circuits selectively providing its first input as its output in response to said first control signal and providing as its output a logical combination of its first and second inputs in response to said second control signal, said first means further comprising slave feedback means responsive to an output from at least one other of said slave flip-flops for providing said second input to each of said second plurality of switch circuits.

4. A logic circuit as claimed in claim 1, wherein said group of master flip-flops comprises a first master flip-flop, a second master flip-flop, at least a third master flip-flop receiving its input from the output of said first master flip-flop and providing an output and at least a fourth master flip-flop receiving the output from said second master flip-flop and providing an output, and wherein said first means comprises:
  a first switch circuit receiving a first bit of said first group of output signals as a first input and receiving a second input, said first switch circuit providing its first input at its output in response to a first control signal and providing a logical combination of its first and second inputs as its output in response to a second control signal, said first switch circuit output being provided as an input to said first master flip-flop;
  at least a second switch circuit receiving a second bit of said first group of output signals as a first input and receiving a second input from the output of said at least third master flip-flop, said second switch circuit providing its first input as its output in response to said first control signal and providing a logical combination of its first and second inputs as its output in response to said second control signal;
  logic means for receiving and logically combining outputs from said at least third and said at least fourth master flip-flops to generate a feedback signal coupled as said second input to said first switch circuit; and
  means for providing said first and second control signals to said switch circuits.

5. A logic circuit as claimed in claim 4, wherein said group of slave flip-flops comprises a first slave flip-flop, a second slave flip-flop, at least a third slave flip-flop receiving its input from the output of said first slave flip-flop and at least a fourth slave flip-flop receiving its input from the output of said second slave flip-flop, and wherein said second means comprises:
  a first slave switch circuit receiving as a first input the output from said first master flip-flop and receiving a second input, said first slave switch circuit providing its first input as its output in response to said first control signal and providing a logical combination of its first and second inputs as its output in response to said second control signal, the output of said first slave switch circuit being provided as an input to said first slave flip-flop;
  a second slave switch circuit receiving as a first input the output from said second master flip-flop and receiving a second input, said second slave switch circuit providing its first input as its output in response to said first control signal and providing its second input as its output in response to said second control signal, said second slave switch circuit receiving its second input from the output of said at least third slave flip-flop; and
  slave logic means for receiving and logically combining outputs from said at least third and at least fourth flip-flops to generate a slave feedback signal provided as said second input to said first slave switch circuit.

6. A logic circuit as claimed in claim 5, wherein said first slave switch circuit further includes a third input for receiving a serial test pattern, said first slave switch circuit providing its third input as its output in response to a third control signal and said second slave switch circuit providing its second input as its output in response to said third control signal, said third control signal being provided by said means for providing said first and second control signals.

7. A logic circuit as claimed in claim 4, wherein said at least third master flip-flop comprises a plurality of flip-flops.

8. A logic circuit as claimed in claims 4 or 7, wherein said at least fourth master flip-flop comprises a plurality of flip-flops.

9. A logic circuit as claimed in claim 5, wherein said at least third slave flip-flop comprises a plurality of flip-flops.

10. A logic circuit as claimed in claims 5 or 9, wherein said at least fourth slave flip-flops comprises a plurality of flip-flops.

* * * * *

UNITED STATES PATENT AND TRADEMARK OFFICE
CERTIFICATE OF CORRECTION

PATENT NO. : 4,424,581

DATED : January 3, 1984

INVENTOR(S) : MASATO KAWAI

It is certified that error appears in the above-identified patent and that said Letters Patent is hereby corrected as shown below:

Column 4, line 56, after "101" delete "to".
Column 5, line 46, after "set" change "in" to --to--;
        line 47, after "the", change "normal" to --reset--.
Column 7, line 26, after "its" change "reset" to --normal--.
Column 8, line 21, after "bit" change "patter" to --pattern--.
Column 10, line 52, after "slave" chage "flip-flops" to --flip-flop--.

Signed and Sealed this

Tenth Day of July 1984

[SEAL]

Attest:

GERALD J. MOSSINGHOFF

Attesting Officer     Commissioner of Patents and Trademarks